US006473779B1

(12) United States Patent
Wolf

(10) Patent No.: US 6,473,779 B1
(45) Date of Patent: Oct. 29, 2002

(54) COMBINATORIAL POLYNOMIAL MULTIPLIER FOR GALOIS FIELD 256 ARITHMETIC

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 962 days.

(21) Appl. No.: 08/725,598

(22) Filed: Oct. 3, 1996

(51) Int. Cl.[7] ................................................. G06F 7/00

(52) U.S. Cl. ........................................................ 708/492

(58) Field of Search .................... 364/717.01, 717.03, 364/717.04, 717.05, 717.07, 746.1; 708/492

(56) References Cited

U.S. PATENT DOCUMENTS 5,502,665 A * 3/1996 Im ........................... 364/746.1
5,689,452 A * 11/1997 Cameron .................. 364/746.1

* cited by examiner

Primary Examiner—Chuong Dinh Ngo
(74) Attorney, Agent, or Firm—Carlton H. Hoel; W. James Brady; Frederick J. Telecky, Jr.

(57) ABSTRACT

A combinatorial polynomial multiplier for Galois Field 256 arithmetic utilizes fewer components than an iterative Galois Field 256 arithmetic multiplier and operates 8 times faster. The combinatorial multiplier employs AND and XOR functions and operates in a single clock cycle. It can reduce the number of transistors required for the Galois Field 256 arithmetic multiplier for a Reed-Solomon decoder by almost 90%.

6 Claims, 5 Drawing Sheets

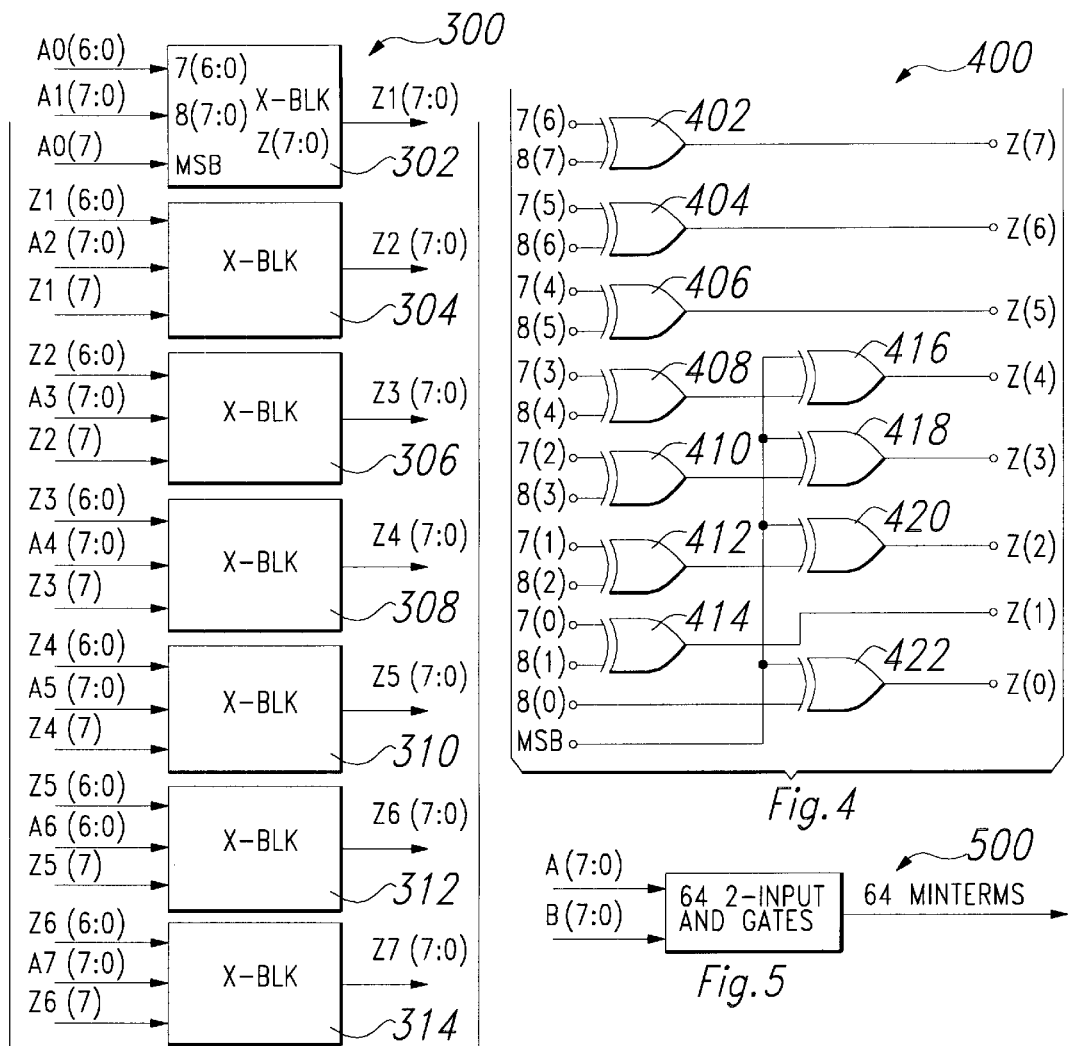
Fig.3
Fig.4
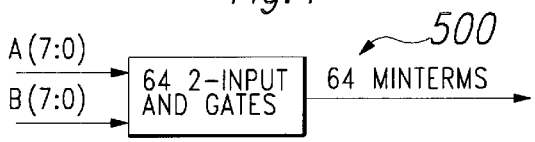
Fig.5
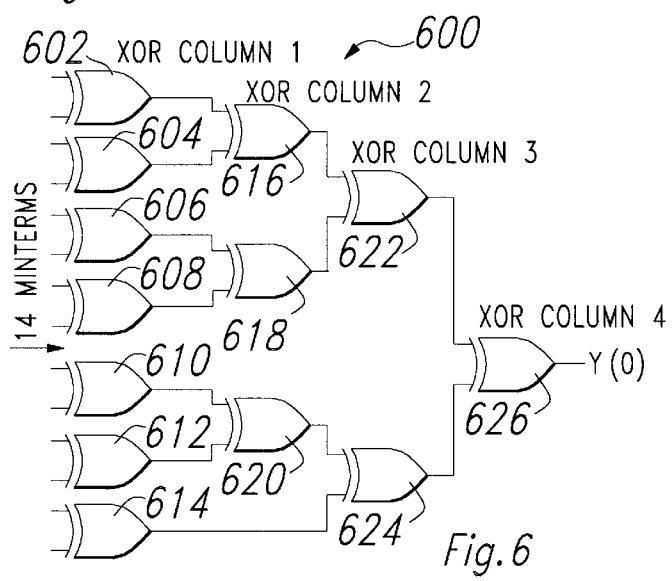
Fig.6

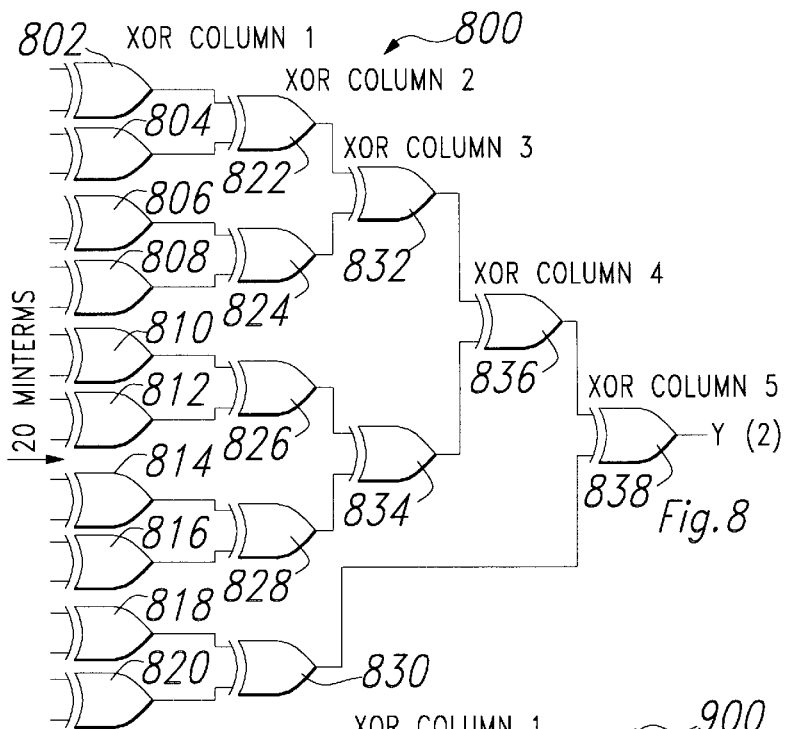
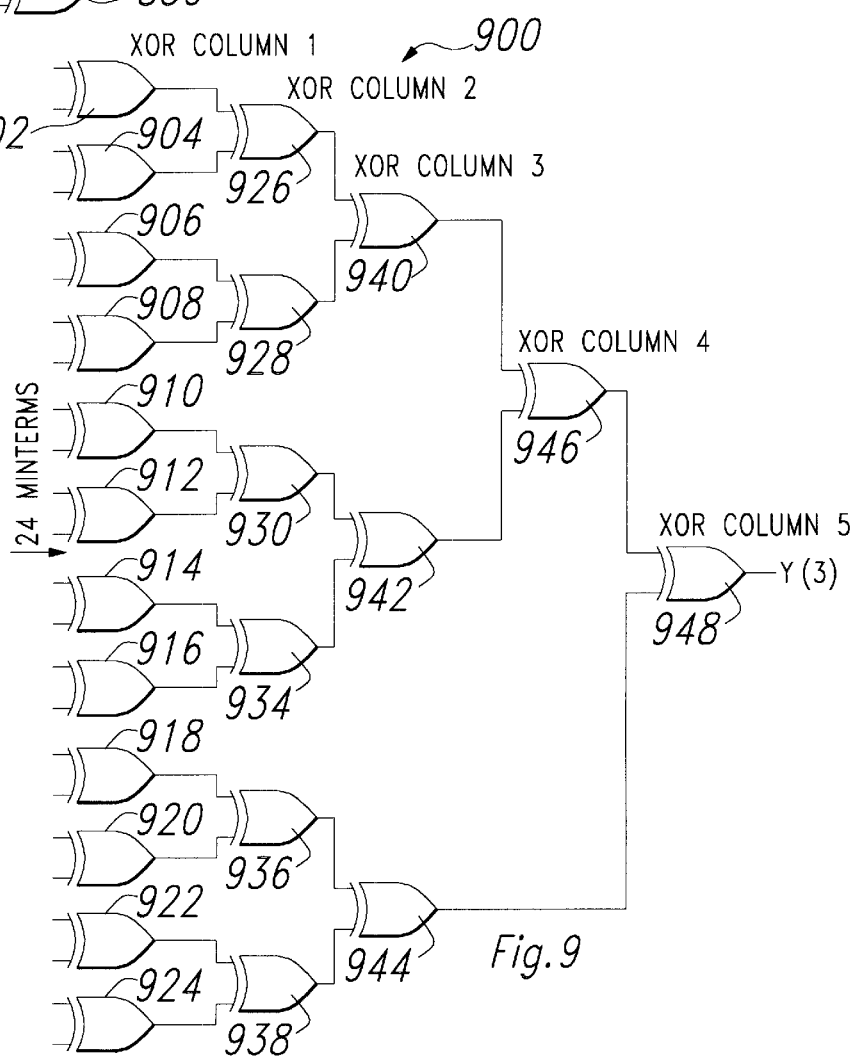

COMBINATORIAL POLYNOMIAL MULTIPLIER FOR GALOIS FIELD 256 ARITHMETIC

BACKGROUND OF THE INVENTION

This invention relates to a technique for multiplication in Galois Field arithmetic and more specifically to a multiplier for a Galois Field 256 arithmetic. Galois Field 256 arithmetic multipliers have a specific application in decoders for Reed-Solomon codes.

Reed-Solomon codes are used as error correcting codes in a wide variety of commercial applications such as compact discs, high speed cable modems, modulation systems for set-top box applications and the current HDTV standard. These codes are typically applied to data transmissions in which the data is transmitted by bytes, thus the interest is in Galois Field 256 arithmetic, as this accommodates 8-bit variables. In Galois Field 256 arithmetic, bytes are also called symbols. The Digital Audio-Visual Council (DAVIC) standard specifies a 204/188/8 Reed-Solomon code. The 204, also known as N, is the number of symbols in the channel codeword. The 204 symbols broadcast over the channel is called a frame. The 188, also known as K, is the number of symbols of information in the source codeword. The 8, also known as T, is the number of errors that can be corrected; the number of errors being equal to one-half of the difference of N and K. In this case, 188 bytes of data has 16 bytes of error correcting codes added to generate 204 bytes per frame. This code can correct for 8 errors in the frame. The correction involves the determination of both the location and the magnitude of the error. A problem with Reed-Solomon codes is that it forces the burden of computation upon the decoder, rather than on the encoder. For example, the code required in the DAVIC standard requires 16 Galois Field multiplications in the encoder and 2,550 Galois Field multiplications in the decoder. In view of the fact that the multiplications performed at the encoder are normally at the broadcast or recording studio level, the cost of such equipment can be amortized over the number of listeners/viewers. However, the decoder must be owned by each listener/viewer where its cost becomes a significant issue.

FIG. 1 shows a typical application of a decoder for Reed-Solomon codes employing Galois Field 256 arithmetic shown generally as 100 in FIG. 1. The signal to be decoded is applied to a delay 102 and a decoder circuit 106 via line 104. The purpose of delay 102 is to delay the signal the amount of time it takes for the decoder 106 to perform the decoding operations. The delay 102 may be a RAM of suitable length, for example. The output of the delay 102 is applied to a circuit 112 as is the output of decoder circuit 106 via line 110. Circuit 112 contains a RAM and the Galois Field arithmetic circuitry to make the corrections to the stored data where errors have been detected. This could involve Galois Field addition of an error correction to the data containing the error, for example. If it would be desirable that the delay be 100 clock cycles, for example, then the RAM 102 would store 100 bytes, after which the data would be loaded into the RAM of circuit 112. The RAM of circuit 112 would have a capacity of 204 bytes, for example, under the DAVIC standard. As the RAM reaches capacity, errors on line 110 would be output to the RAM of circuit 112, in order to correct the errors. By the time the 204 clock cycles of the frame have been completed, all of the entries into the RAM have been made and all the corrections to those entries have also been made. Then data is taken from the top or zero address of the RAM and output to a display (not shown) on line 114 and a new entry is applied to that slot via line 108 and the process repeats. Longer delay times increases the latency of the signal and the size of the RAM that is required for the delay 102.

FIG. 2 shows a prior art polynomial multiplier for Galois Field 256 arithmetic which takes 8 clock cycles to complete the computation. The notation "(7:0)" refers to bits 7-0 of the variable A. The circuit comprises of two multiplexers having inputs of A (6:0) and B (7:0) respectively. The output of multiplexers on lines 214 and 216 are input into registers 220 and 222 respectively. The output of registers 220 and 222 on lines 226 and 230 are fed back to multiplexers 210 and 212 via lines 206 and 208 respectively. Lines 226 and 230 are also fed into multiplexers 238 and 240, respectively. The second input to multiplexer 238 is A(7) on line 228 and the second input to multiplexer 240 is B (7:0) on line 232. The output of the multiplexers 238 and 240 on lines 244 and 246 is input into A-block 248 to produce the result C (7:0) on line 250. Line 250 is coupled into X-block 254 via line 250. The output of X-block 254 on line 218 is the result of Y(7:0) which is fed back to register 224 the output of which is fed via line 234 to multiplexer 242, which also has an input of (0) on line 236. The output of multiplexer 242 on line 252 is Y1(7:0) which is also input into X-block 254. The first cycle ANDs the most significant bit of A with B(7:0), XORs the result with Y(6:0), XORs the primitive polynomial and stores the result. The A register stores the one-bit left-shifted result. The least significant bit is loaded with a 0. These operations are repeated seven more times which produces the file output. This circuit is well known in the prior art.

Returning to FIG. 1, if the delay 102 is desirably no more than 100 clock cycles, for example, and the DAVIC standard is applied, the number of polynomial multipliers for the Galois Field 256 arithmetic that is required is:

2,550 divided by 100=25.5=26

However, the fact that the prior art multipliers require 8 clock cycles to perform a single multiplication, means that 8 times that number of multipliers is required, 8 times 25.5 equalling 204 multipliers in a single decoder. It must be remembered that each CD player, set-top box, etc., that contains a Reed-Solomon decoder must have this number of Galois Field multipliers. The number of multipliers can be decreased by increasing the delay of the delay element 102, but this increases the size of the RAM that is required and increases the latency of the signal. This problem is exasperated by the fact that realizing Reed-Solomon codes for correcting video signals will require a data rate of 5 megabytes per second. If the techniques of the prior art are utilized, this would require a clock frequency of 40 MHz for a single clock cycle multiplier.

Polynomial multipliers for Galois Field arithmetic are very different from multipliers for infinite field variables and are non-intuitive. This can be seen from a simple multiplication example involving Galois Field 4 arithmetic, shown in Table 1. Galois Field 4 arithmetic is illustrated because the table has only 16 entries whereas a table for Galois Field 256 arithmetic has 65,536 entries.

TABLE 1

| X | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

Galois Field 4 arithmetic involves the numerals 0,1,2 and 3 only. It takes only a quick glance at Table 1 to realize how different Galois Field arithmetic multiplications are. According to the table, multiplication of 3×3 yields a result of 2 which is quite astonishing to those not familiar with Galois Field arithmetic.

Galois Field 256 arithmetic contains a set of 256 numbers from 0 to 255. This produces the 65,536 possible combinations referred to above. The large number of possible combinations make other solutions such as the required number of look-up tables (LUTs) impractical. Accordingly, there is a need for a low cost, high speed Galois Field 256 multiplier which is particularly applicable to a decoder for Reed-Solomon codes.

SUMMARY OF THE INVENTION

It is a general object of the present invention to provide a method and apparatus for Galois Field multiplication.

It is a further object of the present invention to provide a method and apparatus for Galois Field 256 arithmetic multiplication.

A still further object of the present invention is to provide a method and apparatus for Galois Field 256 multiplication for a Reed-Solomon code decoder.

Yet another object of the present invention is to provide a low cost method and apparatus for Galois Field 256 multiplication for a Reed-Solomon code decoder.

These and other objects, advantages and features are provided, in accordance with one aspect of the present invention by a combinatorial polynomial multiplier for Galois Field arithmetic. An AND block includes a plurality of 2-input AND gates, the plurality having a number of gates equal to the product of the number of bits in a multiplicand multiplied by the number of bits in a multiplier, each gate having as inputs one bit of the multiplicand and one bit of the multiplier and generating a minterm as an output. An exclusive OR block includes a plurality of 2-input exclusive OR gates in a binary exclusive OR tree, inputs of the exclusive OR block being coupled to the outputs of the AND block to receive the minterms derived from a primitive polynomial for said Galois Field arithmetic for generating a Galois Field product as an output.

Another aspect of the invention comprises a polynomial multiplier for a decoder for Reed-Solomon codes utilizing Galois Field arithmetic. The multiplier includes a combinatorial logic circuit consisting of AND gates and exclusive OR gates.

A further aspect of the invention includes a method of multiplying a Galois Field arithmetic multiplicand by a Galois Field arithmetic multiplier to generate a Galois Field arithmetic product. Each bit of the multiplicand is ANDed with each bit in the multiplier to generate a plurality of minterms equal in number to the product of the number of bits in the multiplicand multiplied, by the number of bits in the multiplier. The minterms are exclusive ORed in an exclusive OR tree for each bit in the product, each tree exclusive ORing the minterms derived from a primitive polynomial for the Galois Field arithmetic for generating a bit of said Galois Field product.

A still further aspect of the invention comprises a method of multiplying polynomials in a method of decoding Reed-Solomon codes utilizing Galois Field arithmetic. An n-bit multiplicand and an n-bit multiplier are provided. The multiplicand is multiplied by the multiplier in an n-bit combinatorial logic circuit Galois Field arithmetic multiplier.

BRIEF DESCRIPTION OF THE DRAWINGS

FIG. 3 shows the iterations of the X-BLK in the embodiment of FIG. 2;

FIG. 4 shows the combinatorial logic circuit of the X-BLK of FIG. 3;

FIG. 5 shows the AND gate portion of the present invention;

FIG. 6 shows the binary XOR tree for (y0);

FIG. 8 shows the binary XOR tree for (y2);

FIG. 9 shows the binary XOR tree for (y3);

DETAILED DESCRIPTION

Figure 2:
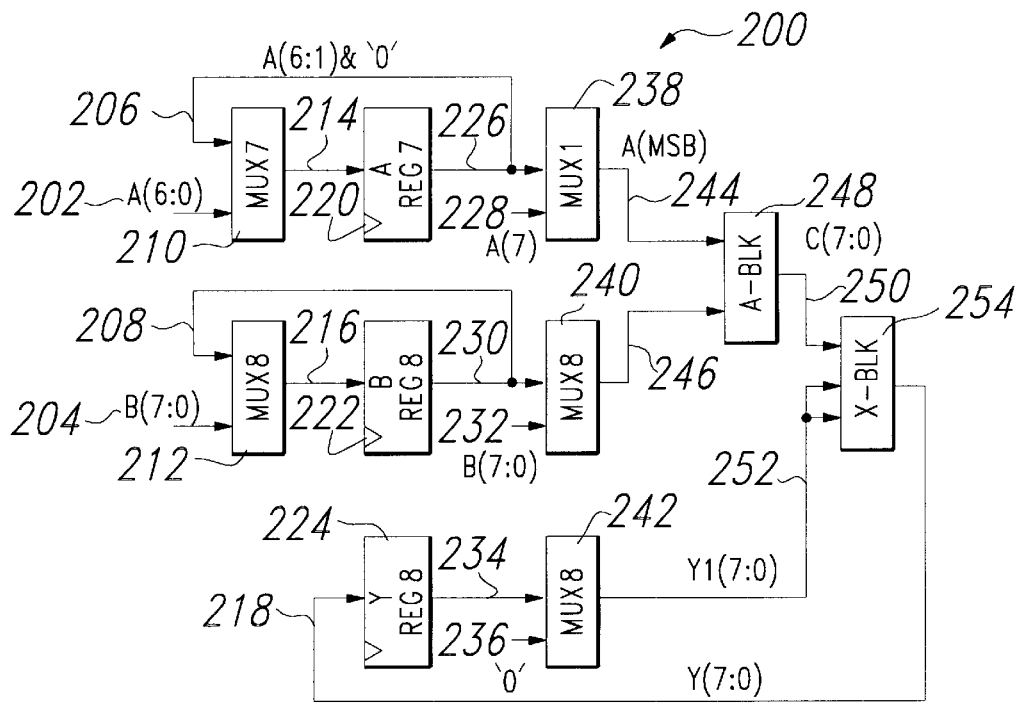
FIG. 2 is a prior art field iterative Galois Field 256 multiplier.

The circuit shown in FIG. 2 is utilized at present for two reasons. First of all, it is assumed that this minimizes the number of components required because of the iterative approach. This is especially important in view of the need for a large number of these multipliers, as illustrated above, for each decoder and the fact that each listener/viewer requires his or her own independent decoder. A second reason for utilization for this prior art circuit, is that one skilled in the art would see the three gate delays that result from this circuit and assume by the fact that 8 cycles are required, that a combinatorial circuit would require a latency of 24 gate delays, which is unacceptably long.

I have discovered that neither of these are true, and in fact, that a combinatorial polynomial multiplier for Galois Field arithmetic 256 can operate at 8 times the speed of the prior art device, with fewer components and a maximum latency of only 6 gate delays.

The total number of transistors for the prior art circuit in FIG. 2 is summarized in Table 2. As can be seen, the implementation requires 1264 transistors. The present invention eliminates the need for the clock registers, and can therefor operate at 8 times the speed of the circuit shown in FIG. 2, and, as will be seen below, requires a total of 1236 transistors, a smaller number than required by the prior art circuit. Thus, in the example shown in FIG. 1 having a delay for element 102 of 100 clock cycles, the number of multipliers is reduced to 25.5 equals 26, instead of 204 multipliers per decoder, thus producing a considerable cost savings

TABLE 2

| BLOCK | NUMBER OF OCCURRENCES | TRANSISTORS PER OCCURRENCE | TOTAL NUMBER OF TRANSISTORS |
|---|---|---|---|
| Register | 23 | 44 | 1012 |
| MUX1 | 1 | 6 | 6 |
| MUX7 | 1 | 30 | 30 |
| MUX8 | 3 | 34 | 102 |
| AND | 8 | 6 | 48 |
| XOR | 11 | 6 | 66 |
| TOTAL | | | 1264 |

Figure 1:
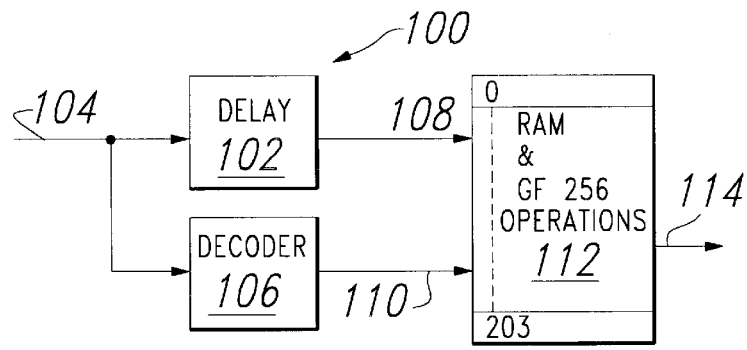
FIG. 1 is a block diagram of a typical prior art Reed-Solomon decoder utilizing Galois Field 256 arithmetic.

The circuit for implementing the present invention can be implemented by utilizing two logic functions, the AND and the exclusive OR (XOR) functions. The equations for the bits of the result Y are derived from the prime polynomial for Galois Field 256 arithmetic as $(p)=x^8+x^4+x^3+x^2+1$. This derivation can be made from the iterative solution of the prior art (FIG. 1). In the iterative solution, the 8-bit variable A, herein labeled A(7:0) is ANDed with the 8 bit variable B, labeled B(7:0) to yield 64 product terms referred to as minterms. The minterms are combined by X-BLK 254 in FIG. 2 to iteratively generate the 8 bits of the answer referred to as Y in FIG. 2. The seven iterations required to produce the 8 bits are shown in FIG. 3. The output of each iteration is referred to as Z1–Z7 and since each contains 8 bits it also has a nomenclature of (7:0). It should be noted that the final iteration, Z7(7:0) is equal to the result of Y(7:0). In the 7 iterations 302–314 utilize the same X-BLK 254 but the variables input to the block vary with each iteration. Notice that the first input to the X-BLK is 7 bits wide and has a designation of (6:0), the second input to the X-BLK is 8 bits wide and has a designation of (7:0) and the last input is a single bit wide and has the designation (7).

TABLE 3

| y | Number of AND minterms | Number of XOR gates in column 1 | Number of XOR gates in column 2 | Number of XOR gates in column 3 | Number of XOR gates in column 4 | Number of XOR gates in column 5 |
|---|---|---|---|---|---|---|
| 7 | 17 | 8 | 4 | 2 | 1 | 1 |
| 6 | 19 | 9 | 5 | 2 | 1 | 1 |
| 5 | 21 | 10 | 5 | 3 | 1 | 1 |
| 4 | 24 | 12 | 6 | 3 | 1 | 1 |
| 3 | 24 | 12 | 6 | 3 | 1 | 1 |
| 2 | 20 | 10 | 5 | 2 | 1 | 1 |
| 1 | 11 | 5 | 3 | 1 | 1 | 0 |
| 0 | 14 | 7 | 3 | 2 | 1 | 0 |
| TOTAL | 150 | 73 | 37 | 18 | 8 | 6 |

Total AND gates required 64   Total XOR gates required 142

The construction of the X-BLK is shown in FIG. 4 generally as 400. As can be seen, the circuit 400 comprises 11 identical 2-input XOR gates 402–422. Gates 402–414 and 422 receive the inputs applied to the X-BLK 254. The 8-bit input is referred to in FIG. 4 as 8(0) through 8(7). The actual variable applied to these inputs is dependent upon the iteration, as shown in FIG. 3. Thus, in the first iteration 302, this will be A1(7:0) which are the 8 minterms generated by the ANDing of the first bit of the A variable with the 8 bits of the B variable. These will be applied as inputs 8(0) through 8(7), respectively. Similarly, the 7-bit input to block 302 is A0(6:0) which are the minterms generated by the zeroth bit of the A variable ANDed with the 8 bits of the B variable and are applied to the inputs 7(0) through 7(6) respectively. The input labeled MSB (most significant bit) is the single bit input which in block 302 is A0(7). The same principle is applied for all 7 iterations of the circuit shown in FIG. 2. The application of these inputs to the first block of FIG. 3 is shown inside block 302 as an illustrative example. The output of blocks 408, 410 and 412 are XORed with the MSB bit applied to XOR gates 416, 418 and 420 to generate outputs Z(4), Z(3) and Z(2). The outputs shown in FIG. 3, referred to as, for example, Z1(7:0) refer to the 8 bits Z(0) through Z(7). The equations for the third and fourth bit terms Y(3) and Y(4) contain the most minterms. A derivation of Y(3) appears below. In this derivation, it should be noted that Z7(3) is the third bit of the seventh iteration in accordance with the convention described above.

y(3) = Z7 (3)
= Z6 (2) XOR A7 (3) XOR Z6 (7)
= Z5 (1) XOR A6 (2) XOR Z5 (7) XOR A7 (3) XOR Z5 (6)
XOR
A6 (7)
= Z4 (0) XOR A5 (1) XOR A6 (2) XOR Z4 (6) XOR A5 (7)
XOR
A7 (3) XOR Z4 (5) XOR A5 (6) XOR A6 (7)
= A4 (0) XOR Z3 (7) XOR A5 (1) XOR A6 (2) XOR Z3 (5)
XOR
A4 (6) XOR A5 (7) XOR A7 (3) XOR Z3 (4) XOR A4 (5)
XOR
A5 (6) XOR A6 (7)
= A4 (0) XOR Z2 (6) XOR A3 (7) XOR A5 (1) XOR A6 (2)
XOR
Z2 (4) XOR A3 (5) XOR A4 (6) XOR A5 (7) XOR A7 (3)
XOR
Z2 (3) XOR A3 (4) XOR Z2 (7) XOR A4 (5) XOR A5 (6)
XOR
A6 (7)
= A4 (0) XOR Z1 (5) XOR A2 (6) XOR A3 (7) XOR A5 (1)
XOR
A6 (2) XOR Z1 (3) XOR A2 (4) XOR Z1 (7) XOR A3 (5)
XOR
A4 (6) XOR A5 (7) XOR A7 (3) XOR Z1 (2) XOR A2 (3)
XOR
Z1 (7) XOR A3 (4) XOR Z1 (6) XOR A2 (7) XOR A4 (5)
XOR
A5 (6) XOR A6 (7)
= A4 (0) XOR Z0 (4) XOR A1 (5) XOR A2 (6) XOR A3 (7)
XOR
A5 (1) XOR A6 (2) XOR Z0 (2) XOR A1 (3) XOR Z0 (7)
XOR
A2 (4) XOR A3 (5) XOR A4 (6) XOR A5 (7) XOR A7 (3)
XOR
Z0 (1) XOR A1 (2) XOR Z0 (7) XOR A2 (3) XOR A3 (4)
XOR
Z0 (5) XOR A1 (6) XOR A2 (7) XOR A4 (5) XOR A5 (6)
XOR
A6 (7)
= A4 (0) XOR A0 (4) XOR A1 (5) XOR A2 (6) XOR
A3 (7) XOR A5 (1) XOR A6 (2) XOR A0 (2) XOR
A1 (3) XOR A2 (4) XOR A3 (5) XOR A4 (6) XOR A5 (7)
XOR
A7 (3) XOR A0 (1) XOR A1 (2) XOR A2 (3) XOR
A3 (4) XOR A0 (5) XOR A1 (6) XOR A2 (7) XOR
A4 (5) XOR A5 (6) XOR A6 (7)
= B (0) A (3) XOR B (4) A (7) XOR B (5) A (6) XOR
B (6) A (5) XOR B (7) A (4) XOR B (1) A (2) XOR
B (2) A (1) XOR B (2) A (7) XOR B (3) A (6) XOR
B (4) A (5) XOR B (5) A (4) XOR B (6) A (3) XOR
B (7) A (2) XOR B (3) A (0) XOR B (1) A (7) XOR
B (2) A (6) XOR B (3) A (5) XOR B (4) A (4) XOR
B (5) A (7) XOR B (6) A (6) XOR B (7) A (5) XOR
B (5) A (3) XOR B (6) A (2) XOR B (7) A (1)
The other bits in the answer can be derived similarly to yield:
y(7) = B (7) A (0) XOR B (5) A (2) XOR B (7) A (6) XOR
B (6) A (7) XOR B (4) A (3) XOR B (7) A (5) XOR
B (6) A (6) XOR B (5) A (7) XOR B (3) A (4) XOR
B (7) A (4) XOR B (6) A (5) XOR B (5) A (6) XOR
B (4) A (7) XOR B (2) A (5) XOR B (1) A (6) XOR
B (0) A (7) XOR B (6) A (1)

-continued y(6) = B (6) A (0) XOR B (7) A (5) XOR B (6) A (6) XOR
B (7) A (4) XOR B (6) A (5) XOR B (5) A (1) XOR
B (5) A (7) XOR B (5) A (6) XOR B (4) A (2) XOR
B (4) A (7) XOR B (4) A (6) XOR B (3) A (3) XOR
B (2) A (4) XOR B (3) A (7) XOR B (1) A (5) XOR
B (0) A (6) XOR B (7) A (3) XOR B (6) A (4) XOR
B (5) A (5)
y(5) = B (0) A (5) XOR B (1) A (4) XOR B (2) A (3) XOR
B (2) A (7) XOR B (3) A (2) XOR B (3) A (7) XOR
B (3) A (6) XOR B (4) A (1) XOR B (4) A (7) XOR
B (4) A (6) XOR B (4) A (5) XOR B (5) A (0) XOR
B (5) A (6) XOR B (5) A (5) XOR B (5) A (4) XOR
B (6) A (5) XOR B (6) A (4) XOR B (6) A (3) XOR
B (7) A (4) XOR B (7) A (3) XOR B (7) A (2)
y(4) = B (0) A (4) XOR B (1) A (3) XOR B (1) A (7) XOR
B (2) A (2) XOR B (2) A (7) XOR B (2) A (6) XOR
B (3) A (1) XOR B (3) A (7) XOR B (3) A (6) XOR
B (3) A (5) XOR B (4) A (0) XOR B (4) A (6) XOR
B (4) A (5) XOR B (4) A (4) XOR B (4) A (5) XOR
B (5) A (4) XOR B (5) A (3) XOR B (6) A (4) XOR
B (6) A (3) XOR B (6) A (2) XOR B (7) A (3) XOR
B (7) A (2) XOR B (7) A (1) XOR B (7) A (7)
y(2) = B (0) A (2) XOR B (1) A (1) XOR B (1) A (7) XOR
B (2) A (0) XOR B (2) A (6) XOR B (3) A (7) XOR
B (3) A (5) XOR B (4) A (6) XOR B (4) A (4) XOR
B (5) A (5) XOR B (5) A (3) XOR B (5) A (7) XOR
B (6) A (4) XOR B (6) A (2) XOR B (6) A (7) XOR
B (6) A (6) XOR B (7) A (3) XOR B (7) A (1) XOR
B (7) A (6) XOR B (7) A (5) XOR
y(1) = B (0) A (1) XOR B (1) A (0) XOR B (2) A (7) XOR
B (3) A (6) XOR B (4) A (5) XOR B (5) A (4) XOR
B (6) A (3) XOR B (6) A (7) XOR B (7) A (2) XOR
B (7) A (7) XOR B (7) A (6)
y(0) = B (0) A (0) XOR B (7) A (1) XOR B (6) A (2) XOR
B (7) A (7) XOR B (5) A (3) XOR B (7) A (6) XOR
B (6) A (7) XOR B (4) A (4) XOR B (7) A (5) XOR
B (6) A (6) XOR B (5) A (7) XOR B (3) A (5) XOR
B (2) A (6) XOR B (1) A (7)

Table 3 shows the implementation of combinatorial polynomial multiplier for Galois Field 256 arithmetic in accordance with the present invention. The first column in Table 3 shows the number of AND minterms the total of which is 150. In view of the fact that the maximum number of combinations is 64, it is clear that some of the minterms are utilized more than once and need not be generated again. The 64 possible combinations of the minterms from the two 8-bit variables require 64 AND gates configured as shown generally as 500 in FIG. 5. In FIG. 5, the 64 2-input AND gates are shown as a block 502 having one input as variable A(7:0) and the second input as the second variable B(7:0). This represents 16 bits being input to the block 502. In block 502, there is one AND gate for each bit of variable A combined with each of the 8 bits of variable B for a total of 64 2-input AND gates to yield a total of 64 minterms at the output.

Each bit in the output requires a combinatorial network of 2-input XOR gates in accordance with Table 3 which summarizes the derivation for each term shown above. FIG. 6 shows the combinatorial XOR tree for y(0) generally as 600. As shown in Table 3, the first column contains seven 2-input XOR gates 602–614. The 14 minterms shown input to the circuit 600 are those shown for y(0) above. The reason why specific minterms are not shown connected to specific input is that the order in which the minterms is applied of the inputs to the gates is arbitrary and does not affect the outcome of the combinatorial network, as is well known to those skilled in the art. The outputs of XOR gates 602 and 604 are combined in XOR gate 616. Similarly, the output of the XOR gates 606 and 608 are combined by XOR gates 618, the output in gates 610 and 612 are combined by gate 620. The output of gates 616 and 618 are combined by gate 622 and the output of 614 and the output of 620 are combined by 624. The output of 622 and 624 are combined by XOR gate 626 to yield the output y(0). The number of gates in the tree can have five layers or columns as illustrated in Table 3 which for y(0) is 7, 3, 2, 1, 0, which means there are no gates in the fifth layer (column).

Figure 7:
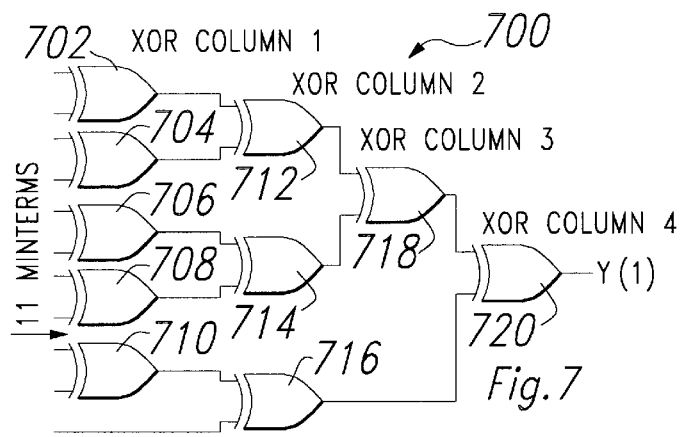
FIG. 7 shows the binary XOR tree for (y1)

Similarly, FIG. 7 shows the XOR gate tree for y(1) generally as 700. The first column contains five gates 702–710. The outputs of gates 702 and 704 are combined by gates 712, the output of gates 706 and 708 are combined by gate 714. The output of gate 710 and the unpaired input are combined by gate 716. The output of gate 712 and 714 are combined by gate 718 the output of which is combined by gate 720 with the output of gate 716 to yield y(1). Again, there are no gates in the fifth column for y(1).

FIG. 8 shows the implementation for y(2) generally as 800. As shown in Table 3, there are 10 XOR gates 802–820 in the first column, 5 XOR gates 822–830 in the second column, 2 XOR gates 832 and 834 in the third column, one XOR gate 836 in the fourth column and one XOR gate 838 in the fifth column. XOR gate 822 combines the output of gates 802 and 804, gate 824 combines the output of gates 806 and 808, gate 826 combines the output of gates 810 and 812, gate 828 combines the output of gates 814 and 816 and gate 830 combines the output of gates 818 and 820. Gate 832 combines the output of gates 822 and 824, gate 834 combines the output of gates 826 and 828. Gate 836 combines the output of gates 832 and 834 and gate 838 combines the output of gates 830 and 836 to yield y(2).

FIG. 9 shows the implementation for y(3) generally as 900. As stated previously, the implementation for y(3) and y(4) involve the maximum number of minterms, 24 minterms. Accordingly, as shown in Table 3, there are 12 2-input XOR gates 902–924 in column 1, six XOR gates in column 2, three XOR gates in column in column 3 and one XOR gate in columns 4 and 5, respectively. As with the other implementations, the XOR gates in column 2 combine the outputs of XOR gates in column 1, the XOR gates in column 3 combine the outputs of XOR gates in column 2, the XOR 946 in column 4 combines the output of two of the XOR gates 940 and 942 in column 3. The XOR gate 948 in column 5 combines the output of the excluded XOR gate 944 with the output of XOR gate 946 to generate y(3).

Figure 10:
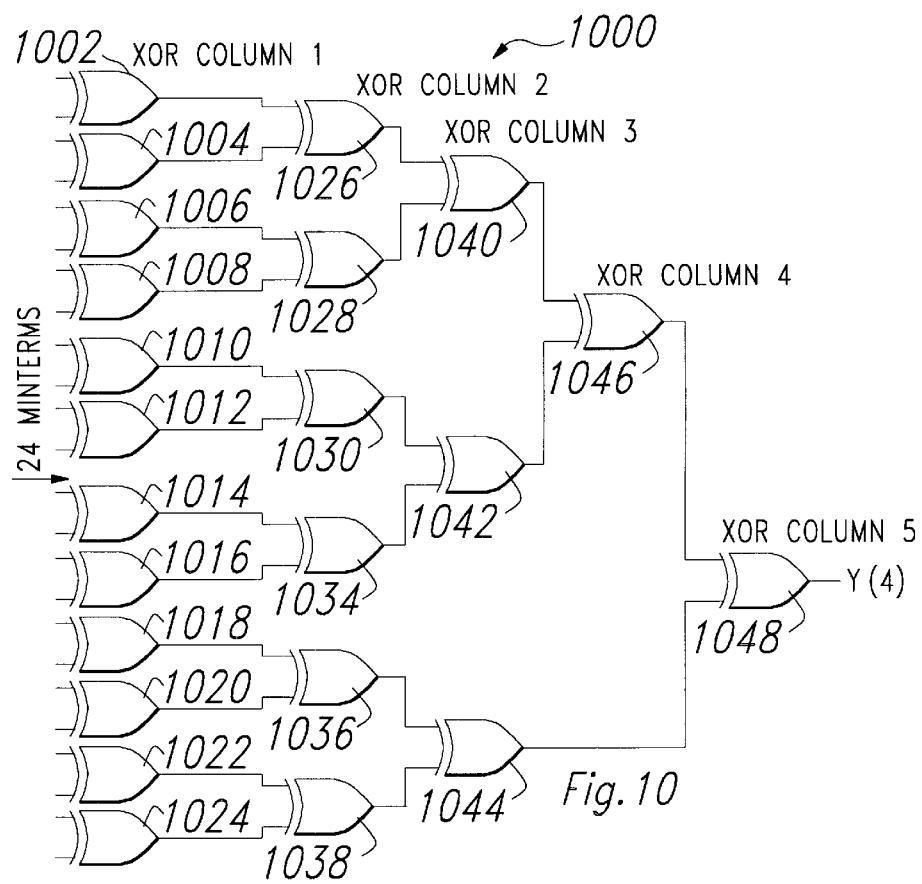
FIG. 10 shows the binary XOR tree for (y4)

FIG. 10 shows the implementation for y(4) generally as 1000. In view of the fact that y(4) involves the same number of terms as y(3), the implementations are identical.

Figure 11:
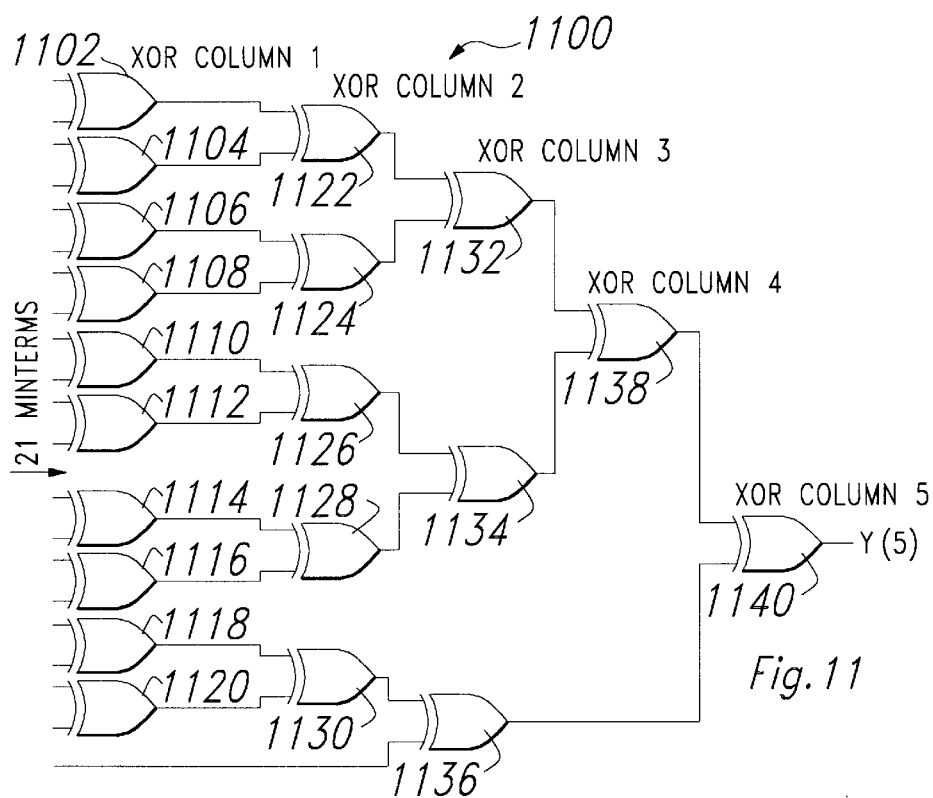
FIG. 11 shows the binary XOR tree for (y5)

FIG. 11 illustrates the implementation for y(5) generally as 1100. As shown in Table 3, there are ten XOR gates in column 1 but there are 21 inputs in accordance with the derivation for y(5). The eleventh input is applied to the XOR gate 1136 of column 3. The outputs of the ten gates in column 1 are combined by the five gates of column 2. The outputs of four of the gates in column 2 are combined by two of the gates 1132 and 1134 of column 3. The third gates in column 3 combines the output of gate 1130 with the odd input. The single gate of column 4 combines the outputs of two of the gates 1132 and 1134 of column 3 whereas the single gate of column 5, 1140 combines the output of the excluded gate 1136 with the output of gate 1138 to yield y(5).

Figure 12:
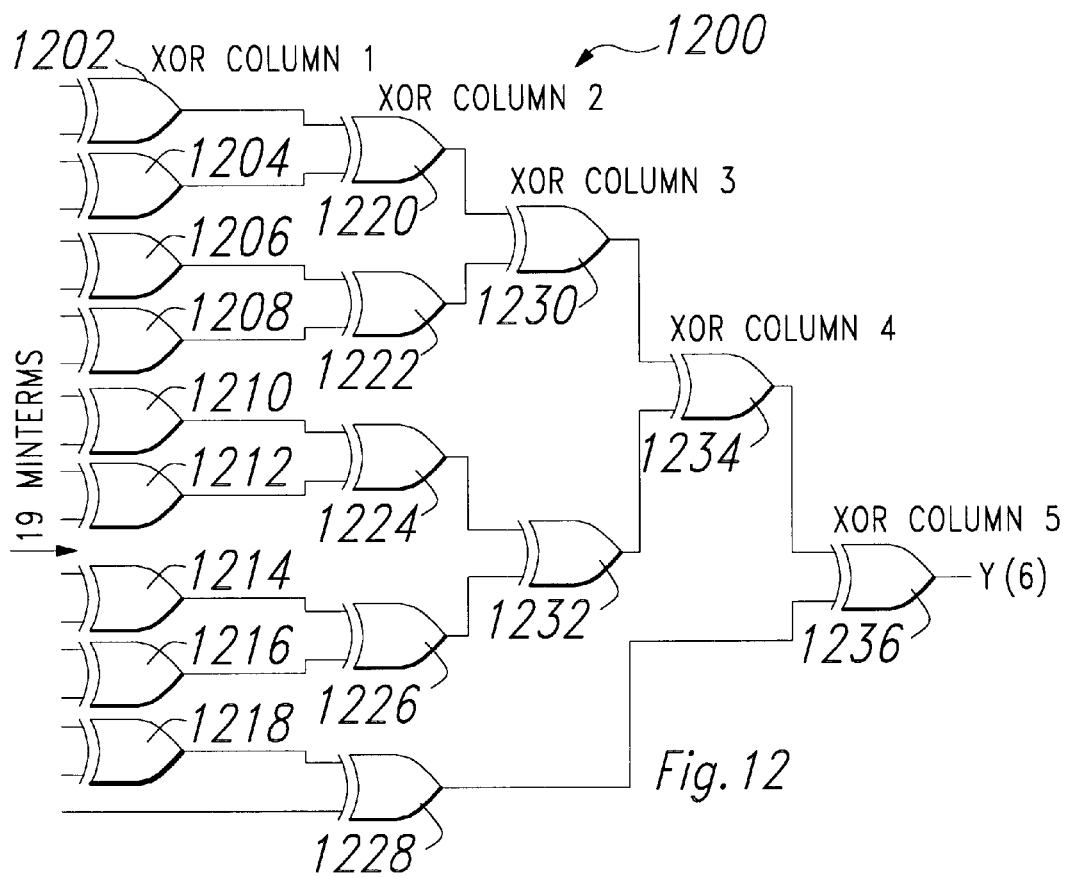
FIG. 12 shows the binary XOR tree for (y6)

FIG. 12 shows the implementation for y(6) generally as 1200. As shown in Table 3, there are nine XOR gates in the first column but according to the derivation of y(6) there are 19 terms input to the circuit 1200. As described in Table 3, there are five gates in column 2, three gates in column 3, and a single gate each in columns 4 and 5. The gates in column 2 combine the output of gates 1202 and 1204, 1206 and 1208, 1210 and 1212, 1214 and 1216. Gate 1228 combines the output of gate 1218 with the odd input. The gates of column 3 combine the outputs of gates 1220 and 1222 and 1224 and 1226. Gate 1234 in column 4 combines the output of gates 1230 and 1232 and gate 1236 of column 5 combines the output of gates 1234 and 1228 to yield y(6).

Figure 13:
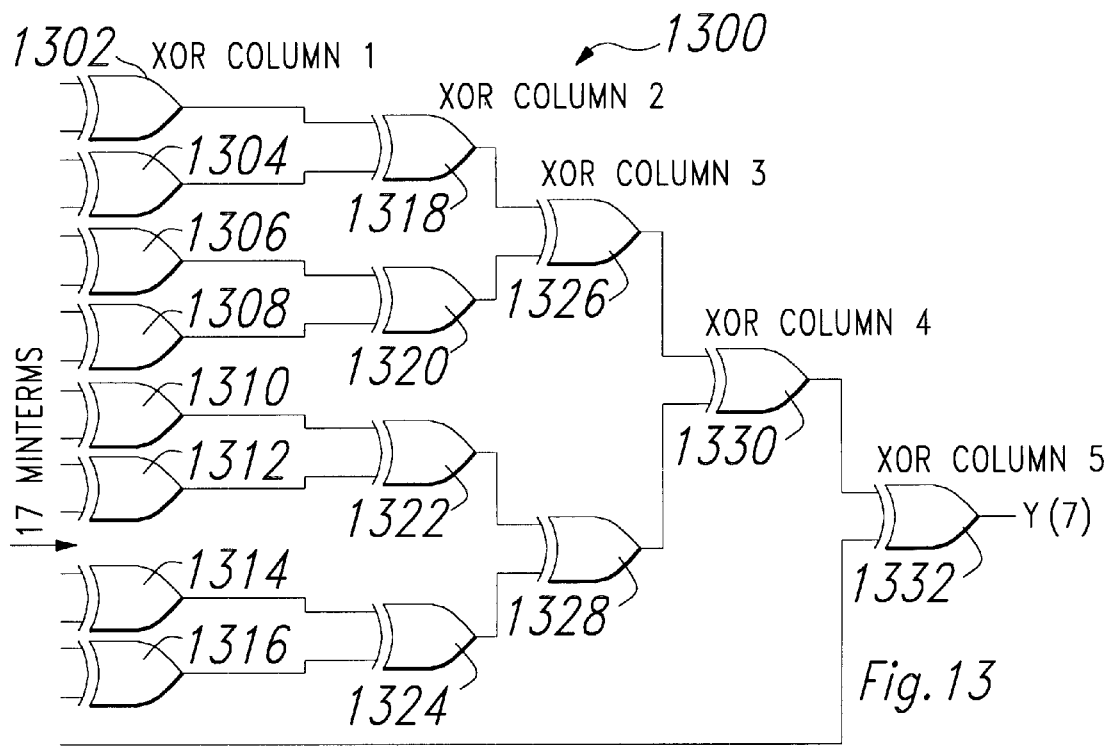
FIG. 13 shows the binary XOR tree for (y7).

FIG. 13 shows implementation for y(7) generally as 1300. As shown in Table 3, there are eight XOR gates 1302–1306 in column one, four XOR gates in column two, two XOR gates in column 3, and a single XOR gate each in columns 4 and 5. Sixteen of the seventeen minterms for y(7) are applied to the inputs of the gates of column 1, the outputs of which are combined by the gates of column 2. The output of the gates of column 2 are combined in pairs by the gates of column 3 the output of which are combined by gate 1330 of column 4. The output of 1330 is combined with the odd input in gate 1332 to yield y(7).

As summarized in Table 3, the implementation of the polynomial multiplier in accordance with the present invention requires 64 AND gates and 142 XOR gates. Each of the gates requires six transistors which means that this implementation requires 384 transistors for the AND gates and 858 transistors for the XOR gates for a combined total of 1242 transistors. As stated in the beginning of this application, the known implementation shown in FIG. 2 requires 1264 transistors, or 22 transistors more than the present invention. The worst case gate delay in the prior art is three gate delays whereas the worst case gate delay of the present invention is one AND gate and five XOR gates. However, the speed of the present invention is 8 times that of the prior art. Translating these numbers to the implementation discussed in connection with FIG. 1, a prior art implementation requiring 1264 transistors for 204 separate polynomial multipliers requires 257,856 transistors whereas an implementation utilizing the present invention which requires 1242 transistors and 26 multipliers requires only 32,292 transistors, for a savings of 225,564 transistors per decoder. Given the fact that each listener/viewer device such as a CD player or a television set-top box, etc., must have its own decoder, the cost savings realized by this implementation is dramatic.

While a particular embodiment of the present invention has been disclosed herein, certain changes and modifications will readily occur to those skilled in the art. For example, although the present implementation has been shown with AND and XOR gates, it is well known to those skilled in the art that these functions can be implemented utilizing other gates to achieve the same functions. All such changes and modifications can be made without departing from the invention as defined by the appended claims.

What is claimed is:

1. A combinatorial polynomial multiplier for Galois Field $2^n$ (n>4) arithmetic comprising:

an AND block comprising a plurality of 2-input AND gates, said plurality having a number of gates equal to the product of the number n of bits in a multiplicand multiplied by the number n of bits in a multiplier, each gate having as inputs a different pair of one bit of said multiplicand and one bit of said multiplier and generating an associated different minterm product as an output;

a plurality of n XOR blocks for respectively generating the n bits of a Galois Field $2^n$ output, each XOR block comprising a plurality of 2-input XOR gates connected in a binary XOR tree derived from a primitive polynomial for said Galois Field $2^n$ arithmetic, inputs of said XOR block being coupled to the outputs of said AND block to receive those of the minterms associated with said primitive polynomial for generating a corresponding different bit of said Galois Field $2^n$ output without feedback.

2. The multiplier of claim 1 wherein said Galois Field arithmetic is Galois Field 256 arithmetic and said multiplicand and multiplier each contain 8 bits.

3. The multiplier of claim 2 wherein said AND block contains 64 2-input AND gates.

4. A method of multiplying a Galois Field $2^n$ arithmetic n-bit multiplicand by a Galois Field $2^n$ arithmetic n-bit multiplier to generate an n-bit Galois Field $2^n$ arithmetic result, where n>4, comprising the steps of:

ANDing a different pair of each bit of said multiplicand and each bit in said multiplier to generate a plurality of associated different n×n minterms;

XORing said minterms in a plurality of n XOR trees derived from a primitive polynomial for said Galois Field $2^n$ arithmetic for respectively generating the bits in said result, each said tree XORing those of the minterms associated with said primitive polynomial for generating a corresponding different bit of said Galois Field result without feedback.

5. The method of claim 4 wherein said Galois Field arithmetic is Galois Field 256 arithmetic and said multiplicand, multiplier and product each contain 8 bits.

6. The method of claim 5 wherein said ANDing step comprises 64 binary AND operations to generate 64 minterms.

* * * * *